(12) United States Patent
McHugh et al.

(10) Patent No.: US 7,371,077 B1
(45) Date of Patent: May 13, 2008

(54) ELECTRICAL CONNECTOR ASSEMBLY

(75) Inventors: Robert G. McHugh, Golden, CO (US); Yu-Chen Chen, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/647,767

(22) Filed: Dec. 28, 2006

(51) Int. Cl.
*H01R 12/00* (2006.01)

(52) U.S. Cl. .................. 439/71; 439/680; 439/630

(58) Field of Classification Search ............ 439/70–71, 439/680, 630–632
See application file for complete search history.

(56) References Cited

U.S. PATENT DOCUMENTS 6,699,047 B1 * 3/2004 McHugh et al. ............... 439/71
7,121,863 B2 * 10/2006 Tsai ........................... 439/331

\* cited by examiner

*Primary Examiner*—Truc Nguyen
(74) *Attorney, Agent, or Firm*—Wei Te Chung

(57) ABSTRACT

An electrical connector assembly (100) in the present invention comprises an insulative housing (100), a plurality contacts (100) received therein, a placement device (100) in shape of hollow case for positioning the chip module (3) onto the housing (2), wherein the placement (1) defines a number of deformable members (42) to engage with the chip module for simplifying the chip module (3) to be inserted therein.

4 Claims, 8 Drawing Sheets

ELECTRICAL CONNECTOR ASSEMBLY

BACKGROUND OF THE INVENTION

1. Field of the Invention

The present invention relates to an electrical connector assembly, and more particularly to an electrical connector assembly for securing mounting a chip module to an electrical connector.

2. Description of the Prior Art

Land grid array (LGA) electrical connectors are widely used in the connector industry for electrically connecting LGA chips to printed circuit boards (PCBs) in personal computers (PCs). Conventionally, one kind of the LGA connector mainly comprises an insulative housing, a multiplicity of contacts received therein, The housing defines a multiplicity of terminal passageways in a rectangular array, for interferentially receiving corresponding contacts. In assembly, the terminals are inserted into the passageways of the housing. Secondly, the housing is attached on a printed circuit board. Then chip module is mounted onto the housing by manual for getting an electrical connection between conductive pads of the chip module and the terminals received in the housing. Consequently, the housing and the chip module are usually disengaged for manual operating and the conductive pads and the terminals are usually destroyed by the disengagement between the housing and the chip module.

Thus, there is a need to provide a new electrical connector that overcomes the above-mentioned problems.

SUMMARY OF THE INVENTION

Accordingly, an object of the present invention is to provide an electrical connector able to reliably secure a chip module on a printed circuit board.

To fulfill the above-mentioned object, an electrical connector assembly in accordance with a preferred embodiment of the present invention comprises an insulative housing, a plurality contacts received therein, a placement device in shape of hollow case for positioning the chip module onto the housing.

As an improvement of the invention, the placement device further defines a pair of securing members inserted into the housing which can be altered for fitting different chip modules.

Relative to the conventional electrical connector assembly, The electrical connector assembly in the invention can provide a placement device used for accurate positioning the chip module onto the housing. in addition, the placement device defines guiding members for leading the chip module to engaging with the housing.

Other objects, advantages and novel features of the present invention will become more apparent from the following detailed description when taken in conjunction with the accompanying drawings, in which:

DESCRIPTION OF PREFERRED EMBODIMENT OF THE INVENTION

Figure 1:
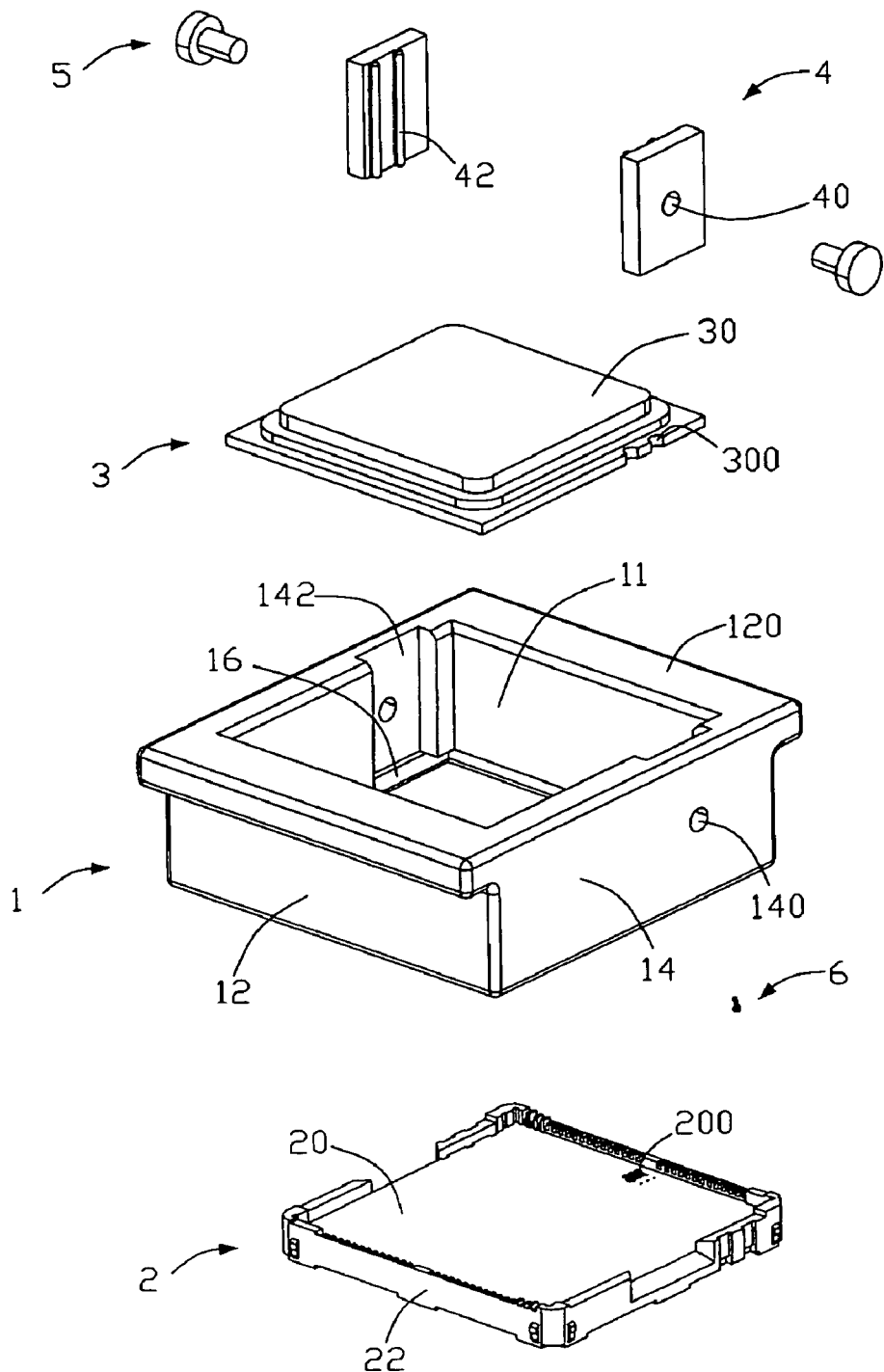
FIG. 1 is an exploded, isometric view of an electrical connector assembly in accordance with a first embodiment of the present invention.

Reference will now be made to the drawings to describe the present invention in detail.

The electrical connector assembly 100 in accordance with the first embodiment of the invention comprises a chip module 3, a generally rectangular insulative housing 2, a multiplicity of contacts 6 received in the housing 2, a placement device 1 for positioning the chip module 3 onto the housing 2 accurately, a pair of securing member 4 for engaging with placement device 1 to guide the chip module to be inserted into the a pair of fastening device 5 for fixing the securing member 4 on the placement device 1.

Figure 2:
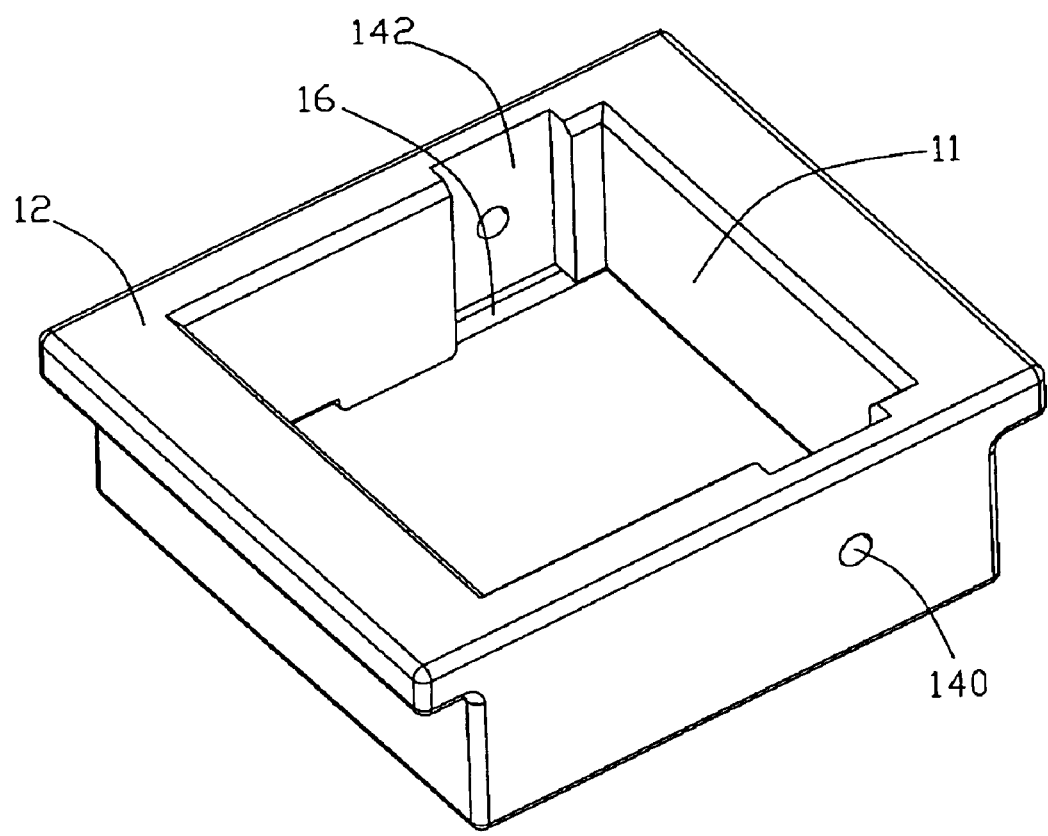
FIG. 2 is a perspective view of the placement device shown in FIG. 1.
Figure 3:
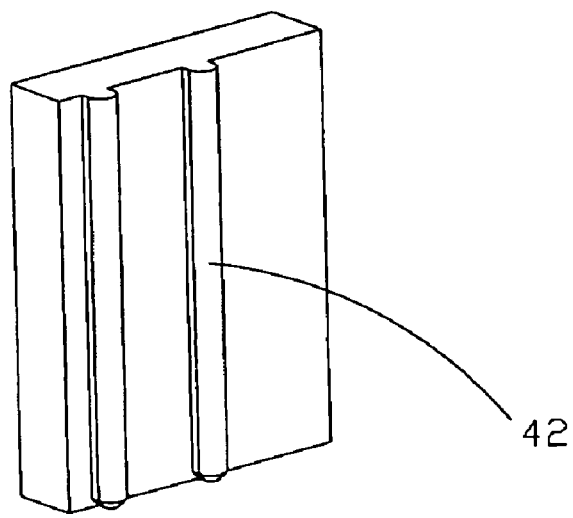
FIG. 3 is a perspective view of the securing members shown in FIG. 1.
Figure 3:
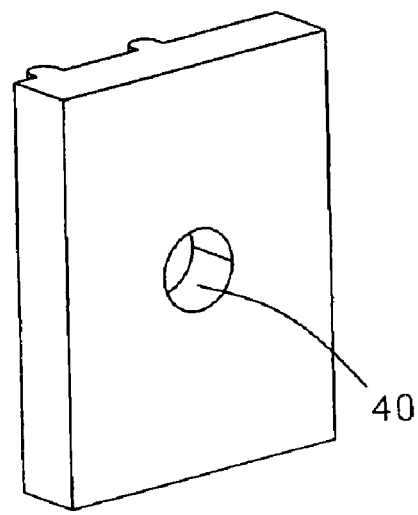
Figure 4:
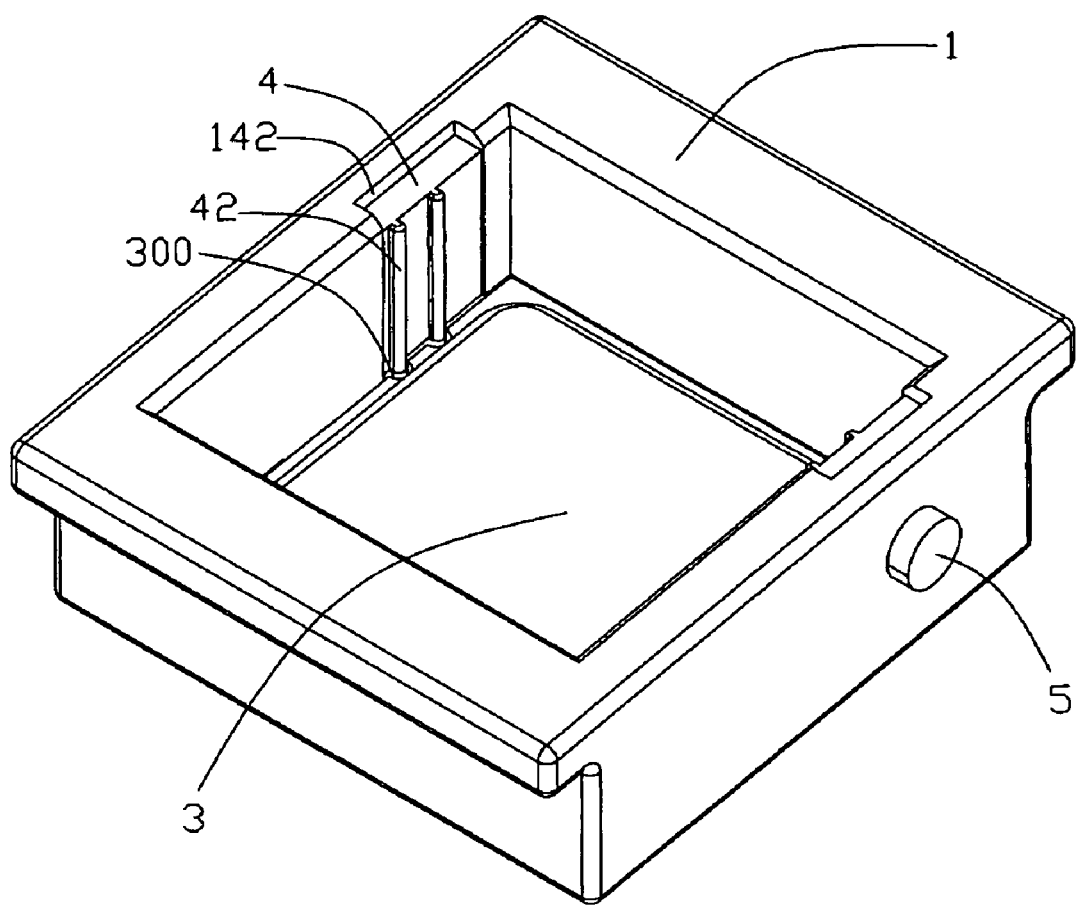
FIG. 4 is an assembled view of the electrical connector assembly shown in FIG. 1.
Figure 5:
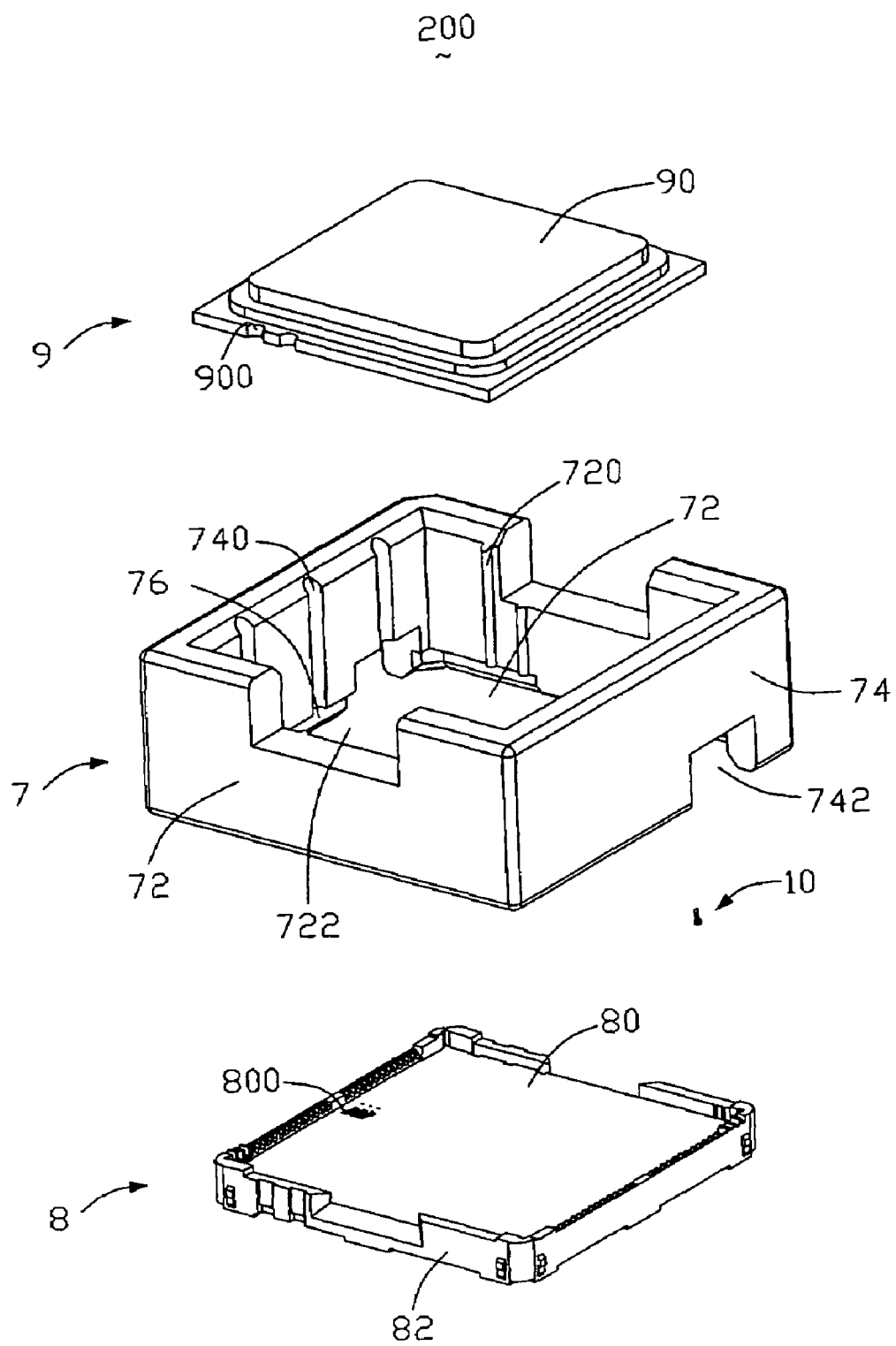
FIG. 5 is an exploded, isometric view of an electrical connector assembly in accordance with a second embodiment of the present invention.
Figure 6:
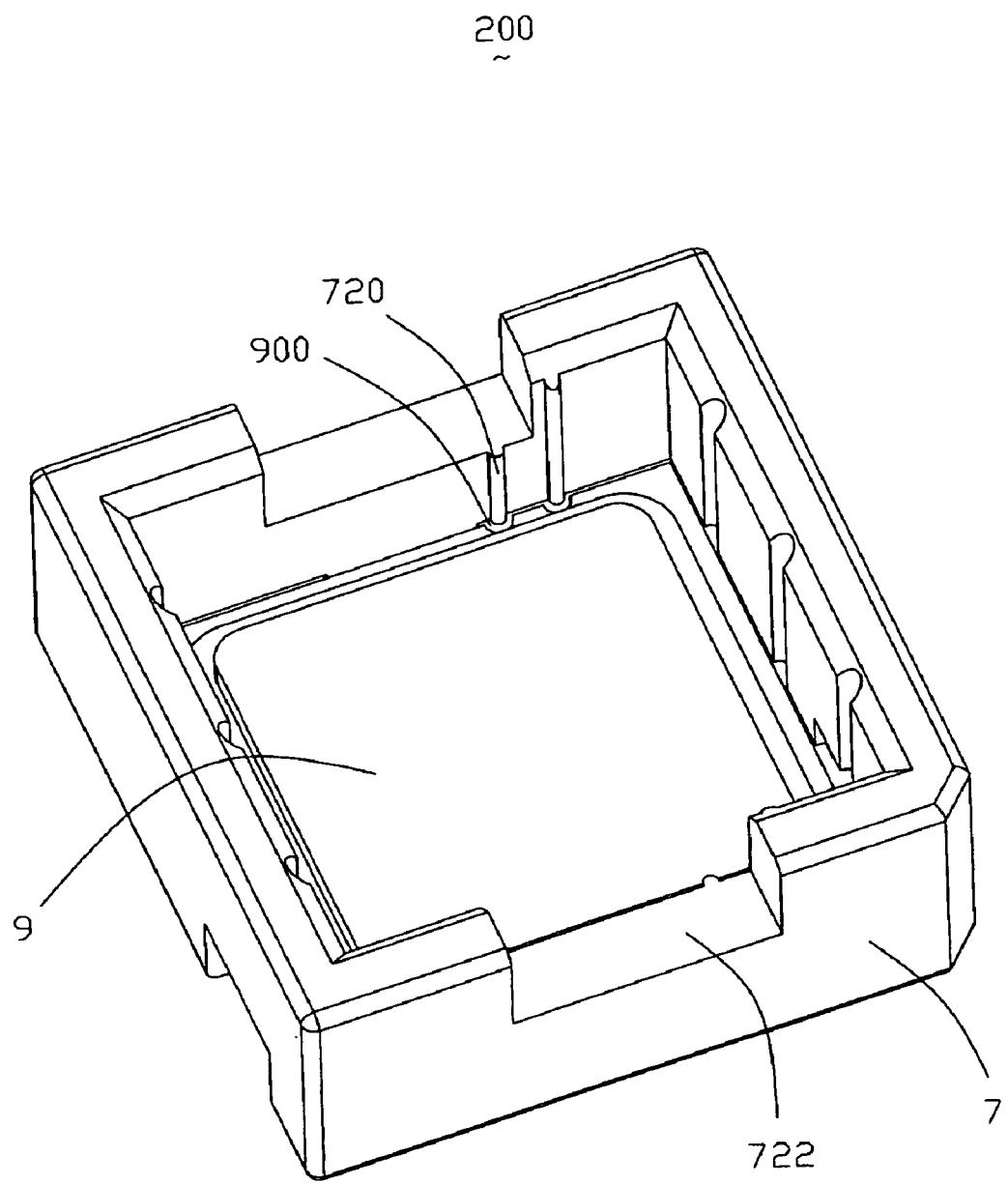
FIG. 6 is a perspective view of the placement device receiving the chip module therein shown in FIG. 5.
Figure 7:
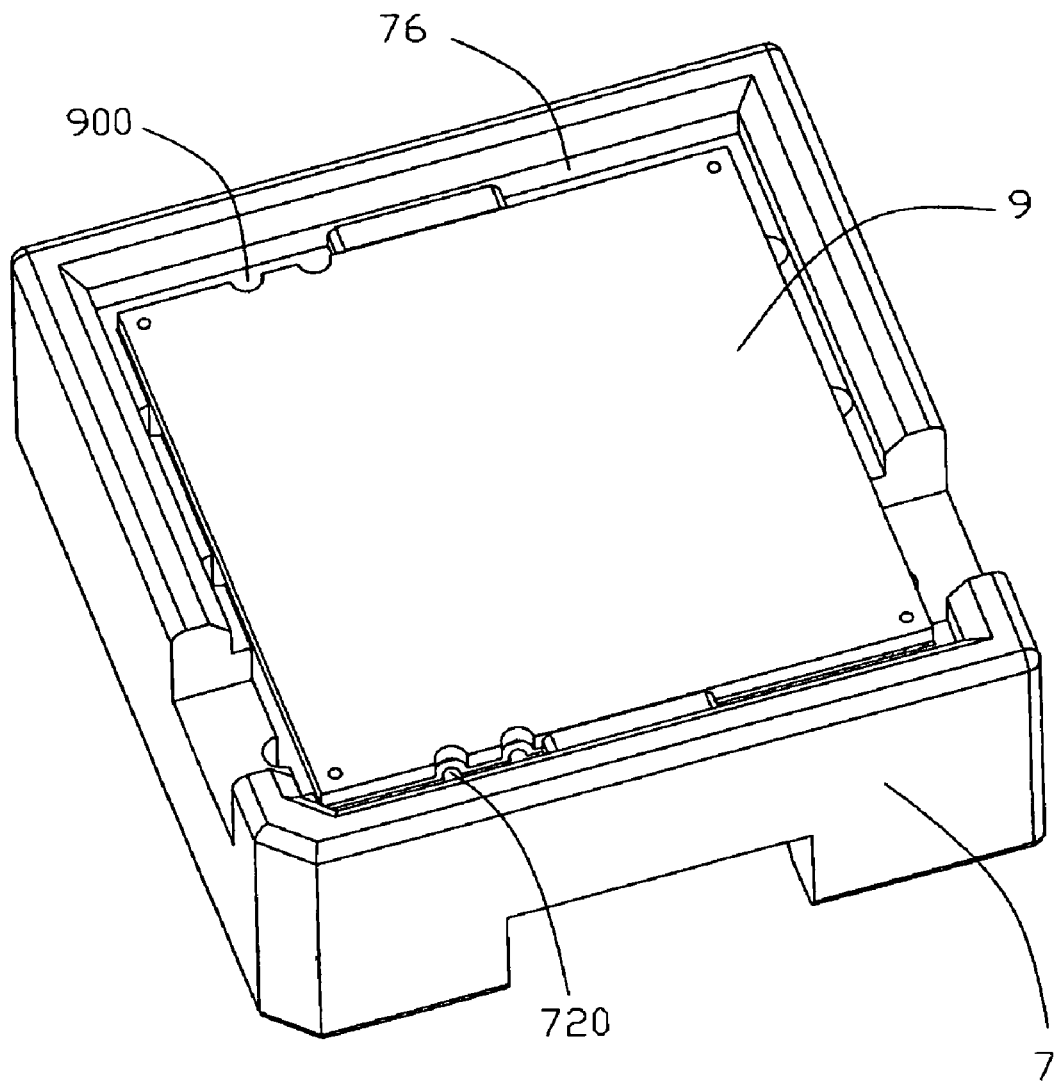
FIG. 7 is another perspective view of the placement device receiving the chip module therein shown in FIG. 5.
Figure 8:
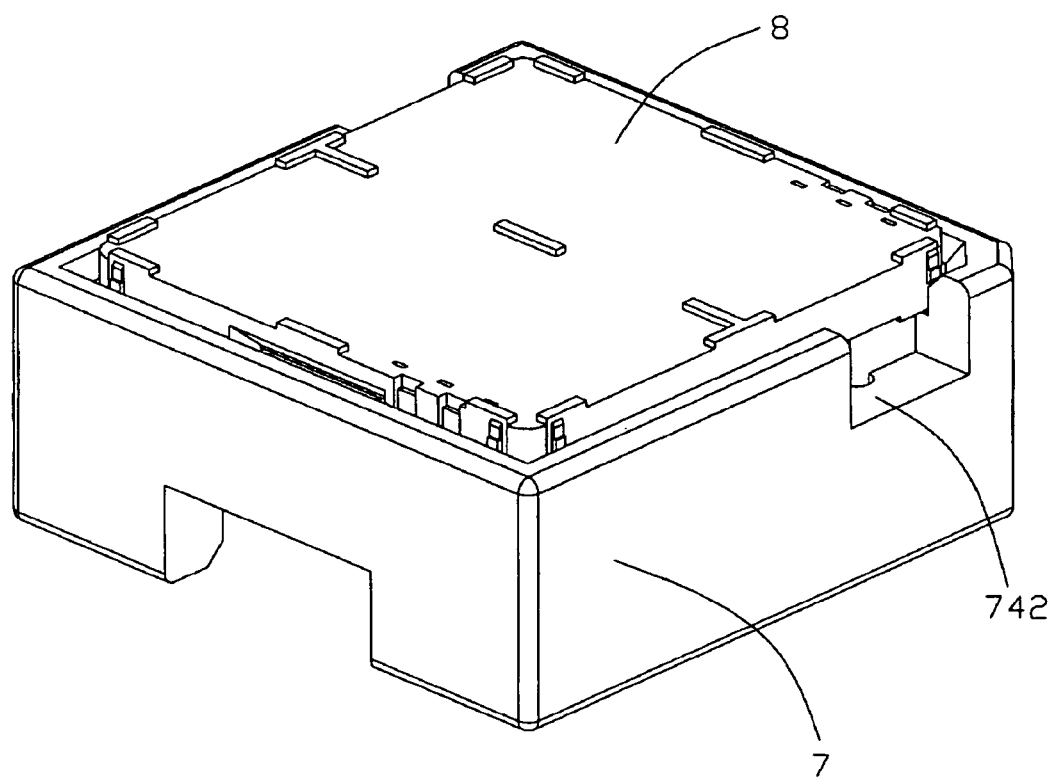
FIG. 8 is an assembled view of the electrical connector assembly described in FIG. 5.

Referring to FIGS. 1-2, In the first embodiment of the invention, the electrical connector assembly 1 comprises the housing 2, a placement device 1 is configured as a rectangular hollow case for the chip module 3 therein enveloped by four sidewalls 10 which extend in an insertion direction of the chip module 3 relative to the housing 2, the four sidewalls comprise a pair of first sidewall 12 opposite to each other, and a pair of opposite second sidewalls 14 interconnecting the first sidewalls 12 cooperatively form a receiving chamber 11 for providing a space for engaging the chip module 3 to the housing 2. The second sidewalls 14 each define an elongate recess 142, which penetrates through the second sidewall 14 in the height direction but not pass cross the thickness direction of the second sidewall 14 and a pair of holes 140 for receiving the fastening device 5 therein. The first sidewalls 12 each extend outwardly an extending platform 120 for facilitating the carrying of the device 1. In addition, the device 1 further defines a receiving section 16 for receiving the housing 2 on a bottom end thereof, which is defined as a receiving step configuration.

The chip module 3 is configured as a rectangular shape and comprises a body portion 30 and a number of receiving holes 300 on two opposite lateral sides thereof for engaging with the securing member 4.

The securing member 4 is configured as rectangular shape and comprises a number of deformable members 42 on a side thereof and a receiving hole 40 on another side opposite to the side formed deformable members 42, wherein the hole 40 does not penetrate the member 4 in a thickness direction.

In assembly, the contacts 6 are firstly inserted into the passageways 20 of the housing 2, then the housing 2 assembled the contacts 6 is assembled to the receiving section 104 of the bottom end of the placement device 1, successively, the securing member 4 is inserted into the channels 102 of the placement device 1, and then using the fasting means 5 pass through the holes 101 and receiving hole 40 to fix the securing member 4 on the placement device 1, then the chip module 3 is inserted into the placement device 1 from a top end of the placement device 1 with the deformable members 42 engaging with holes 300 of the chip module 3, and push the chip module 4 downwardly to engage with the housing 20, hence, the chip module 3 is accurately positioned on the housing 2 and the conductive pads of the chip module 3 are connected with terminals 6 received in the housing 2 correctly.

The electrical connector assembly 200 in accordance with the second embodiment of the invention comprises a chip module 9, a generally rectangular insulative housing 8, a multiplicity of contacts 10 received in the housing 8, a placement device 7 for positioning the chip module 9 onto the housing 8 accurately.

The housing 8 defines a generally rectangular base portion 80 in a middle thereof and four sidewalls 81 extending from sides of the base portion 80. The base portion 80 is used for receiving the chip module 9 therein. A multiplicity of passageways 800 are defined in a portion of the housing 8 under the base portion 80, the passageways 800 receiving a corresponding number of the contacts 10 therein respectively.

The placement device 7 is configured as a rectangular hollow case for the chip module 9 therein enveloped by four sidewalls which extend in an insertion direction of the chip module 9 relative to the housing 8, the four sidewalls comprise a pair of first sidewall 72 opposite to each other and a pair of opposite second sidewalls 74 interconnecting the first sidewalls 72 cooperatively form a receiving chamber 700 for providing a space for engaging the chip module 9 with the housing 8. The first sidewalls 72 each define a number of deformable members 720 extending in the insertion direction of the chip module 9 relative to the placement device 7, which pass through the sidewalls in their height direction. The device 7 further defines a pair of recesses 722 on top ends of the first sidewalls opposite to each other. The second sidewalls 74 each define a plurality of channel 740 on inner walls thereof for decreasing the interfering force between the chip module 9 and the placement device 7. In addition, the device 7 further defines a receiving section 76 for receiving the housing 8 on a bottom end thereof, which is defined as a receiving step configuration.

In assembly, the contacts 10 are firstly inserted into the passageways 800 of the housing 8, then the housing 8 assembled the contacts 10 is assembled to the receiving section 76 of the bottom end of the placement device 7, successively, the chip module 9 is inserted into the placement device 7 with the deformable members 720 engaging with holes 900 of the chip module 9, and push the chip module 9 downwardly to engage with the housing 8 mounted on a bottom end of the placement device 7, hence, the chip module 9 is accurately positioned on the housing 8 and the conductive pads of the chip module 9 are connected with terminals 10 received in the housing 8 correctly.

The electrical connector assemblies of the invention provide an accurate and easy means for mounting the chip module onto the housing, which avoids the conductive pads of the chip module are disengaging with the terminals of housing, hence the electrical connection between the housing and chip module is more secure and reliable. In addition, the invention provides two kinds of electrical connector assemblies, one is in a shape of integrity structure, which is easy to assembly, and carrying, the other is configured as a separation structure the securing member of which can be altered for fitting different kinds of chip modules.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical connector assembly comprising:
   an insulative housing defining a substantially rectangular cavity in a middle thereof to receive an integrated circuit chip module therein;
   a plurality of electrical contacts received in the housing to electrically contact to the integrated circuit chip module;
   a placement device is configured to assembling the integrated circuit chip module onto the housing;
   wherein the placement device further comprises a number of channels on inner surface of a sidewall extending along the insertion direction of the integrated circuit chip module and not extending through the sidewalls in their thickness direction;
   wherein a number of securing members engaging with the channels to securely holding the integrated circuit chip module inside the insulative housing.

2. An electrical connector assembly comprising:
   an insulative housing defining a substantially rectangular cavity in a middle thereof to receive an integrated circuit chip module therein;
   the integrated circuit chip module having a number of holes on sides thereof;
   a plurality of electrical contacts received in the housing to electrically contact to the integrated circuit chip module;
   a placement device formed into a hollow case to receive the integrated circuit chip module and housing therein;
   wherein the placement device defines a number of deformable members on inner surface of sidewalls thereof to engage with holes of the integrated circuit chip module to securely holding the integrated circuit chip module inside the insulative housing.

3. An electrical connector assembly comprising:
   an electrical connector including an insulative housing with a upward module receiving space;
   a placement device including a shallow connector receiving cavity and a deep module receiving cavity in alignment with the upward module receiving space;
   an integrated circuit chip module having at least one notch at an edge thereof;
   wherein the housing is upwardly inserted into the shallow connector receiving cavity;
   wherein the place device is equipped with a deformable protrusions located around an interior wall of the placement device and extending along a vertical direction and dimensioned to comply with the notch so as to allow stable and smooth assembling of the module into the insulative housing via said placement device.

4. The electrical assembly as claim in claim 3, wherein at least one groove located around the interior wall and extending along said vertical direction so as to allow the air to be released when downwardly assembling the integrated circuit chip module to the connector via said placement device.

* * * * *